United States Patent
Morse et al.

(10) Patent No.: US 9,958,711 B1
(45) Date of Patent: May 1, 2018

(54) CONTROL SYSTEM USING A PHASE MODULATION CAPABLE ACOUSTO-OPTIC MODULATOR FOR DIVERTING LASER OUTPUT INTENSITY NOISE TO A FIRST ORDER LASER LIGHT BEAM AND RELATED METHODS

(71) Applicant: Harris Corporation, Melbourne, FL (US)

(72) Inventors: Randall K. Morse, Palm Bay, FL (US); Peter A. Wasilousky, Indialantic, FL (US); Lee M. Burberry, West Melbourne, FL (US); Michael R. Lange, Melbourne, FL (US); Catheryn D. Logan, Melbourne, FL (US); Pat O. Bentley, West Melbourne, FL (US)

(73) Assignee: HARRIS CORPORATION, Melbourne, FL (US)

(*) Notice: Subject to any disclaimer, the term of this patent is extended or adjusted under 35 U.S.C. 154(b) by 0 days. days.

(21) Appl. No.: 15/342,372

(22) Filed: Nov. 3, 2016

(51) Int. Cl.
G02F 1/33 (2006.01)
G02F 1/01 (2006.01)
(Continued)

(52) U.S. Cl.
CPC ............ *G02F 1/113* (2013.01); *B23K 26/067* (2013.01); *B23K 26/362* (2013.01); *G02B 27/10* (2013.01);
(Continued)

(58) Field of Classification Search
CPC . G02F 1/113; G02F 1/11; G02F 3/026; G02F 3/02; G02F 3/022; G02F 2002/008;
(Continued)

(56) References Cited

U.S. PATENT DOCUMENTS 3,731,231 A 5/1973 Torguet
4,256,362 A 3/1981 Bardos
(Continued)

FOREIGN PATENT DOCUMENTS

CA 2484320 10/2005

OTHER PUBLICATIONS

Nadlinger, David "Laser Intensity Stabilization and Pulse Shaping for Trapped-Ion Experiments using Acousto-Optic Modulators" Thesis; Physicds BSc Semester Project: Fall Semester 2013 with the Trapped Ion Quantum Information Group ETH Zurich. http://www.tiqi.ethz.ch/publications-and-awards/semester-theses.html: pp. 45.

(Continued)

*Primary Examiner* — Bumsuk Won
*Assistant Examiner* — Collin X Beatty
(74) *Attorney, Agent, or Firm* — Allen, Dyer, Doppelt + Gilchrist, P.A., Attorneys at Law

(57) ABSTRACT

A laser system may include a laser source configured to generate a laser light beam and an acousto-optic modulator (AOM). The AOM may include an acousto-optic medium configured to receive the laser light beam, and a phased array transducer comprising a plurality of electrodes coupled to the acousto-optic medium and configured to cause the acousto-optic medium to output a zero order laser light beam and a first order diffracted laser light beam. The system may further include a beamsplitter downstream from the AOM and configured to split a sampled laser light beam from the zero order laser light beam, a photodetector configured to receive the sampled laser light beam and generate a feedback signal associated therewith, and a radio frequency (RF) driver configured to generate an RF drive signal to the phased array transducer electrodes so that noise is diverted to the first order diffracted laser light beam based upon the feedback signal.

24 Claims, 3 Drawing Sheets

(51) Int. Cl.

| | |
|---|---|
| *G02B 26/00* | (2006.01) |
| *G02F 1/11* | (2006.01) |
| *H01S 3/00* | (2006.01) |
| *G02B 27/10* | (2006.01) |
| *G21K 1/00* | (2006.01) |
| *H01L 21/67* | (2006.01) |
| *H01L 21/027* | (2006.01) |
| *H01L 21/268* | (2006.01) |
| *B23K 26/362* | (2014.01) |
| *B23K 26/067* | (2006.01) |

(52) U.S. Cl.
CPC ............ *G21K 1/00* (2013.01); *H01L 21/0273* (2013.01); *H01L 21/268* (2013.01); *H01L 21/67115* (2013.01); *H01S 3/0085* (2013.01)

(58) Field of Classification Search
CPC .... G02B 27/10; B23K 26/067; B23K 26/362; G21K 1/00; H01L 21/0273; H01L 21/268; H01L 21/67115; H01S 3/0085; H03K 19/14
USPC .................. 359/285–287, 239, 307, 372
See application file for complete search history.

(56) References Cited

U.S. PATENT DOCUMENTS

| | | | |
|---|---|---|---|
| 4,672,192 A * | 6/1987 | Muka .................. | G02F 1/113 250/205 |
| 4,956,650 A | 9/1990 | Allen et al. | |
| 5,363,363 A | 11/1994 | Gage | |
| 5,373,385 A | 12/1994 | Darcie et al. | |
| 5,386,221 A | 1/1995 | Allen et al. | |
| 5,631,762 A | 5/1997 | Kataoka | |
| 5,923,460 A | 7/1999 | Stewart et al. | |
| 6,320,989 B1 | 11/2001 | Montgomery et al. | |
| 6,487,324 B2 | 11/2002 | Montgomery et al. | |
| 6,538,690 B1 | 3/2003 | Montgomery et al. | |
| 6,621,511 B2 | 9/2003 | Shibayama et al. | |
| 6,765,709 B1 | 7/2004 | Montgomery et al. | |
| 6,870,658 B2 | 3/2005 | Wasilousky | |
| 7,483,196 B2 * | 1/2009 | Allen .................. | G01J 1/4257 359/285 |
| 7,538,929 B2 | 5/2009 | Wasilousky | |
| 7,667,882 B2 | 2/2010 | Adibi et al. | |
| 7,920,265 B1 | 4/2011 | George | |
| 8,442,373 B2 | 5/2013 | Hartl et al. | |

OTHER PUBLICATIONS

Ye et al. "Delivery of high-stability optical and microwave frequency standards over an optical fiber network" https://www.osapublishing.org/josab/abstract.cfm?URI=josab-20-7-1459; Journal of the Optical Society of America B vol. 20, Issue 7, pp. 1459-1467 (2003) Abstract Only.

Fuller et al. "Experimental Implementations of Two-Dimensional Fourier Transform Electronic Spectroscopy" http://www.annualreviews.org/doi/abs/10.1146/annurev-physchem-040513-103623: Annual Review of Physical Chemistry vol. 66: 667-690 (volume publication date Apr. 2015) Abstract Only.

A. Gh. Podoleanu, "Optical coherence tomography" http://onlinelibrary.wiley.com/doi/10.1111/j.1365-2818.2012.03619.x/pdf: Journal of Microscopy, 2012 Recieved Oct. 18, 2011; accepted Mar. 9, 2012: pp. 11.

Slater, Dan "Passive long range acousto-optic sensor" SPIE 6304, Free-Space Laser Communications VI, 63040E (Sep. 1, 2006); Abstract Only.

U.S. Appl. No. 15/342,350, filed Nov. 3, 2016.
U.S. Appl. No. 15/342,357, filed Nov. 3, 2016.

* cited by examiner

CONTROL SYSTEM USING A PHASE MODULATION CAPABLE ACOUSTO-OPTIC MODULATOR FOR DIVERTING LASER OUTPUT INTENSITY NOISE TO A FIRST ORDER LASER LIGHT BEAM AND RELATED METHODS

TECHNICAL FIELD

The present invention relates to the field of optical devices, and, more particularly, to acousto-optic modulators for lasers and related methods.

BACKGROUND

Acousto-optic modulators, sometimes referred to as Bragg cells, diffract and shift light using sound waves at radio frequency. These devices are often used for Q-switching, signal modulation in telecommunications systems, laser scanning and beam intensity control, frequency shifting, and wavelength filtering in spectroscopy systems. Many other applications lend themselves to using acousto-optic devices.

In such acousto-optic devices, a piezoelectric transducer, sometimes also referred to as an RF transducer, is secured to an acousto-optic bulk medium as a transparent optical material, for example, fused silica, quartz or similar glass material. An electric RF signal oscillates and drives the transducer to vibrate and create sound waves within the transparent medium which effect the properties of an optical field in the medium via the photo elastic effect, in which a modulating strain field of an ultrasonic wave is coupled to an index of refraction for the acousto-optic bulk medium. As a result, the refractive index change in amplitude is proportional to that of sound.

The index of refraction is changed by moving periodic planes of expansion and compression in the acousto-optic bulk material. Incoming light scatters because of the resulting periodic index modulation and interference, similar to Bragg diffraction.

Acousto-optic modulators are preferred in many applications because they are faster than tiltable mirrors and other mechanical devices. The time it takes for the acousto-optic modulator to shift an exiting optical beam is limited to the transit time of the sound wave. The acousto-optic modulators are often used in Q-switches where a laser produces a pulsed output beam at high peak power, typically in the Kilowatt range. This output could be higher than lasers operating a continuous wave (CW) or constant output mode.

Examples of acousto-optic modulator devices and similar acousto-optic systems are disclosed in commonly assigned U.S. Pat. Nos. 4,256,362; 5,923,460; 6,320,989; 6,487,324; 6,538,690; 6,765,709; and 6,870,658, the disclosures of which are hereby incorporated by reference in their entireties.

Some applications using acousto-optic devices modulate the intensity of an optical beam. This modulation may create small deviations in the output angle of the diffracted beam because of the local thermal transients introduced when the RF modulation waveform to the device is turned ON and OFF. These thermal transients may negatively impact the resolution and location of the focused spot, which may be produced. One advantageous approach which may be used to help enhance the resolution of acousto-optic devices is set forth in U.S. Pat. No. 7,538,929 to Wasilousky, which is assigned to the present Applicant and is hereby incorporated herein in its entirety by reference. Wasilousky discloses an acousto-optic modulator which includes an acousto-optic bulk medium and transducer attached to the acousto-optic bulk medium and formed as a linear array of electrodes. A transducer driver is connected to each electrode and is coherently phase driven to alter the angular momentum distribution of an acoustic field and alternately allow and inhibit phase matching between the optical and acoustic field and produce a desired intensity modulation of an optical wavefront.

Despite the existence of such configurations, further advancements in laser systems using acousto-optic modulators may be desirable in certain applications.

SUMMARY

A laser system may include a laser source configured to generate a laser light beam and an acousto-optic modulator (AOM). The AOM may include an acousto-optic medium configured to receive the laser light beam, and a phased array transducer comprising a plurality of electrodes coupled to the acousto-optic medium and configured to cause the acousto-optic medium to output a zero order laser light beam and a first order diffracted laser light beam. The system may further include a beamsplitter downstream from the AOM and configured to split a sampled laser light beam from the zero order laser light beam, a photodetector configured to receive the sampled laser light beam and generate a feedback signal associated therewith, and a radio frequency (RF) driver configured to generate an RF drive signal to the phased array transducer electrodes so that noise is diverted to the first order diffracted laser light beam based upon the feedback signal.

More particularly, the RF driver may be configured to drive alternating electrodes of the phased array transducer electrodes with different phases. By way of example, the RF driver may be configured to drive the alternating electrodes with different phases within a range of 0° to 180°. Furthermore, the RF power level associated with the drive signal may have a constant power.

The sampled laser light beam may utilize ≤3% of the light of the zero order laser light beam, for example. Also by way of example, at the set point the first order diffracted light beam may also utilize a similarly small percentage of the laser light from the laser source. For example, the first order diffracted laser light beam have ≤3% of the light from the laser source.

In one example embodiment, the laser system may further include an ion trap, and the beamsplitter may be configured to direct the zero order laser light beam from the AOM to the ion trap. In accordance with another example, the laser system may further include a semiconductor workpiece having a photoresist layer, and the beamsplitter may be configured to direct the zero order laser light beam from the AOM to the photoresist layer. In still another example, the laser system may further include a micromachining workpiece, and the beamsplitter may be configured to direct the zero order laser light beam from the AOM to the micromachining workpiece.

A related method may include generating a laser light beam using a laser source and directed at an acousto-optic medium, causing the acousto-optic medium to output a zero order laser light beam and a first order diffracted laser light beam using a phased array comprising a plurality of electrodes coupled to the acousto-optic medium, and splitting a sampled laser light beam from the zero order laser light beam using a beamsplitter downstream from the acousto-optic medium. The method may further include generating a feedback signal associated with the sampled laser light beam using a photodetector, and generating an RF drive signal to the phased array transducer electrodes with an RF driver so that noise is diverted to the first order diffracted laser light beam based upon the feedback signal.

DETAILED DESCRIPTION OF THE EMBODIMENTS

The present description is made with reference to the accompanying drawings, in which exemplary embodiments are shown. However, many different embodiments may be used, and thus the description should not be construed as limited to the particular embodiments set forth herein. Rather, these embodiments are provided so that this disclosure will be thorough and complete. Like numbers refer to like elements throughout.

By way of background, excessive noise levels from laser sources in optical illumination systems generate instabilities and errors. In particular, systems that manipulate the quantum states of particles, atoms and electrons, typically require extreme stability. Beam pointing errors correlate to noise in quantum state manipulation systems. Moreover, beam pointing stability due to thermal transients in the bulk material of active acousto-optic devices in an optical illumination system affect many applications, but especially those designed for quantum state illumination.

Figure 1:
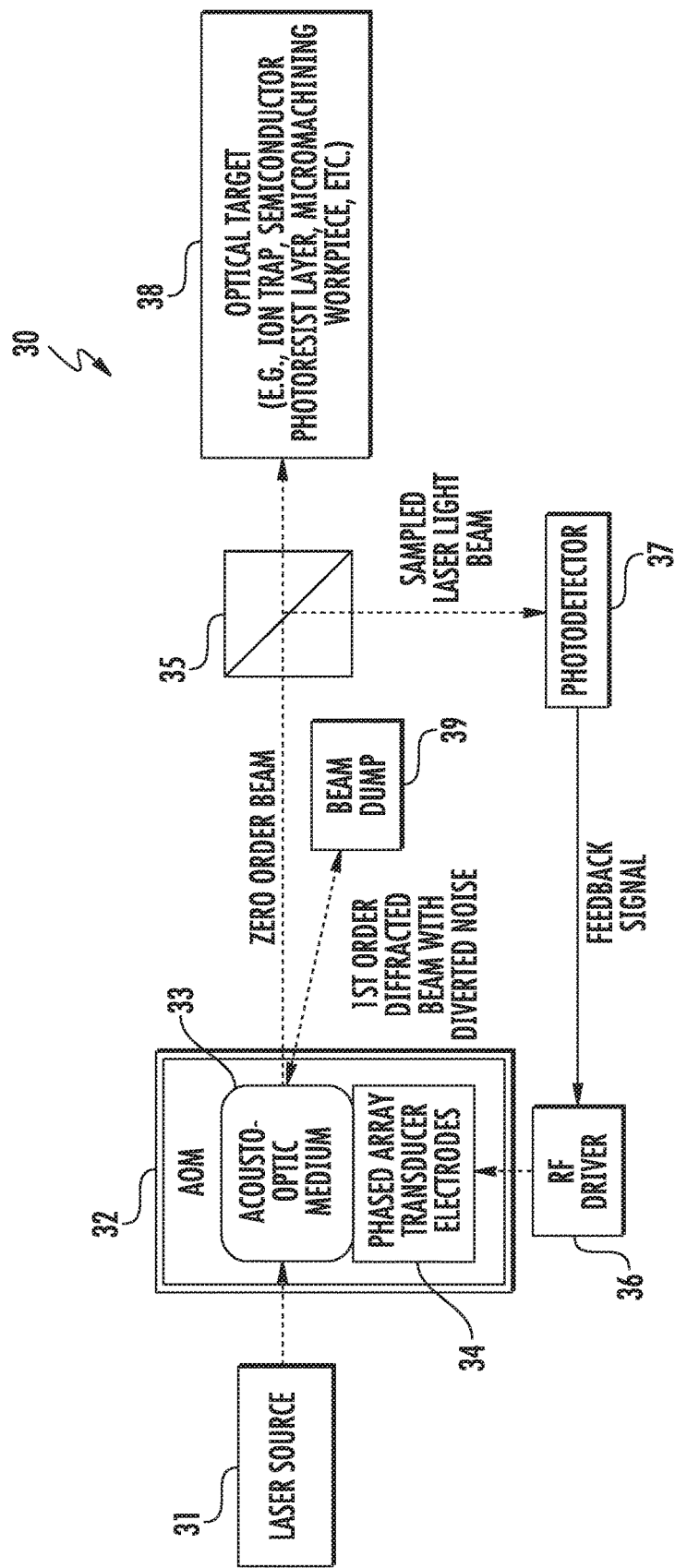
FIG. 1 is a schematic block diagram of a laser system including a phase-capable acousto-optic modulator (AOM) in accordance with an example embodiment.
Figure 4:
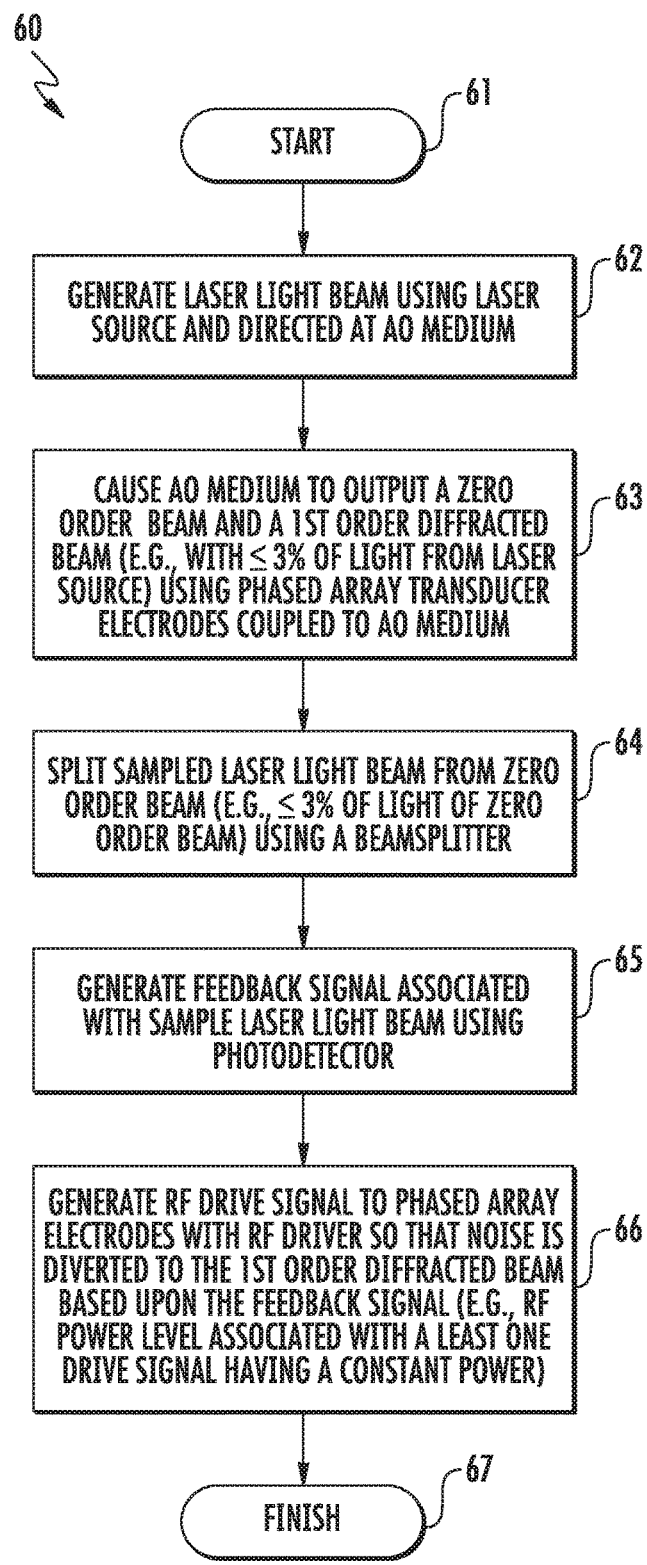
FIG. 4 is a flow diagram illustrating method aspects associated with the system of FIG. 1.

Referring initially to FIGS. 1 and 4, a laser system 30 and associated method aspects which may provide enhanced stability and noise reduction are first described. Beginning at Block 61 of the flow diagram 60, the laser system 30 illustratively includes a laser source 31 configured to generate a laser light beam, at Block 62. In accordance with one example embodiment, a Paladin Advanced 355 nm mode locked UV laser source from Coherent, Inc. of Santa Clara, Calif. may be used, although other suitable laser sources may also be used in different embodiments. The system 30 further illustratively includes an acousto-optic modulator (AOM) 32. The AOM illustratively includes an acousto-optic medium 33 configured to receive the laser light beam from the laser source 31, and a phased array of electrodes 34 coupled to the acousto-optic medium. The acousto-optic medium 33 may include a piezoelectric transducer and bulk acousto-optic medium (e.g., silica, quartz, glass, etc.), as discussed above. The phased array of electrodes 34 are configured to cause the acousto-optic medium 33 to output a zero order laser light beam to an optical target 38, and a first order diffracted laser light beam, at Block 63, as will be discussed further below.

The system further illustratively includes a beamsplitter 35 downstream from the AOM 32 which is configured to split a sampled laser light beam from the zero order laser light beam, at Block 64. The beamsplitter 35 need only divert a small portion of light from the zero order laser light beam into the sampled laser light beam (e.g., ≤3%) to provide adequate feedback to a radio frequency (RF) driver 36 for driving the phase array of electrodes 34. More particularly, a photodetector 37 is configured to receive the sampled laser light beam and generate an electrical feedback signal for the RF driver 36 based upon the sampled laser light beam. As such, the RF driver 36 is able to generate one or more RF drive signals to the phased array of electrodes 34 to generate the zero order beam and the first order diffracted beam accordingly, which illustratively concludes the method of FIG. 4 (Block 67).

In particular, the RF driver 36 drives the phased array of electrodes 34 such that noise measured from the feedback signal is diverted to the first order diffracted laser light beam, which may be directed to a beam dump 39 (or simply away from the optical target 38). This advantageously provides noise cancelation by diffracting a relatively small amount of light from the zero order beam (e.g., ≤3%) into the first order diffracted beam by changing the phase of the RF drive signal to alternating electrode elements of the phased array of electrodes 34. In particular, the feedback signal is inverted and sent to the phase modulation capable AOM 32 to subtract and correct for the inherent noise in the laser.

This may be done while the RF power applied to the acousto-optic medium 33 remains essentially constant which helps to eliminate beam pointing errors which may otherwise be associated with varying thermal transients due to changing RF power levels, as may be experienced with typical amplitude modulation AOMs, for example. Stated alternatively, by only effecting the phase of the RF drive signal to the N element phased array electrode pattern on the AOM and leaving the RF power level essentially constant, this advantageously reduces the laser intensity noise appearing on the zero order beam while still retaining a positionally stable beam.

Figure 2:
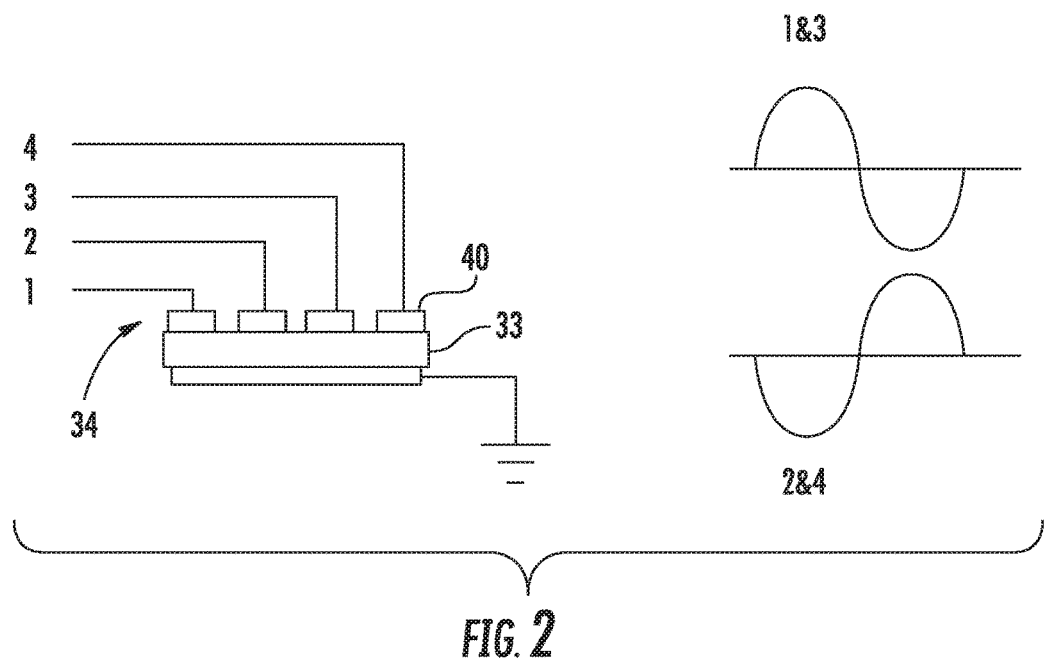
FIGS. 2 and 3 are schematic circuit diagrams illustrating different electrode connection configurations and associated driving signals therefor which may be used with the systems of FIGS. 1-3.
Figure 3:
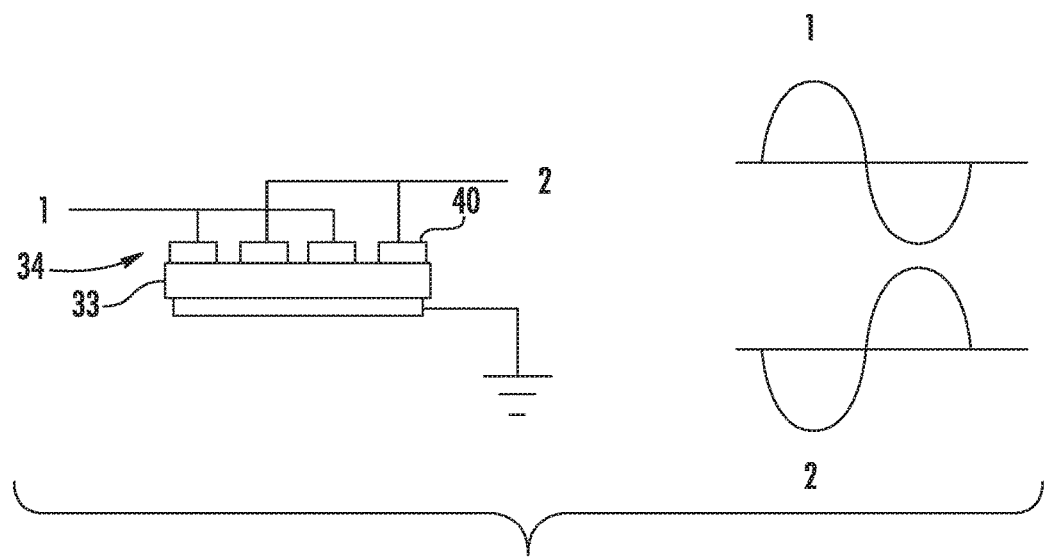

More particularly, referring additionally to FIGS. 2 and 3, two example configurations for driving alternating electrodes 40 of the phased array of electrodes 34 with different phases to provide the zero and first order beam configuration described above are now described. In the first configuration (FIG. 2), the first and third driving signals (shown on the right hand side of FIG. 2) provided to corresponding odd numbered electrodes are 180° out of phase with the second and fourth driving signals provided to corresponding even numbered electrodes. In the second configuration (FIG. 3), first and second drive signals are respectively connected to odd and even electrodes in an interdigitated fashion as shown, and as before these drive signals are 180° out of phase to one another. In this way, directly adjacent electrodes are driven at opposite phases to one another. However, it should be noted that the RF drive signals need not always be 180° out of phase, i.e., they may be somewhere between 0° and 180° to vary the level of phase matching occurring in the AO diffraction process, thereby selectively altering the amount of light directed from the zero order beam into the first order beam.

The system 30 accordingly combines intensity modulation via RF-phase variation on a phased array transducer with active optical feedback to accomplish noise cancelation in an optical illumination system. Moreover, performing phase modulation by flipping the phase of alternating elements of a multi-element phased array has inherently better pointing stability because the RF power applied to the device remains essentially constant, as noted above. Further, applying this to the zero order beam allows the RF power to remain low, reducing the potential of thermal gradients and thermal transients.

The system 30 may accordingly provide advantages with respect to numerous different types of optical targets. By way of example, in one configuration the optical target 38 may be an ion trap, such as in a quantum computing device. In accordance with another example, the optical target 38 may be a semiconductor workpiece to perform photolithographic patterning of a photoresist layer, for example. In still another example, the optical target 38 may be a micromachining workpiece. It should be noted that the laser system 30 may be used with other optical targets in different embodiments as well.

Other example systems in which the above-described stability and noise reduction techniques may be used are set forth in the following co-pending applications: U.S. patent application Ser. No. 15/342,357 filed Nov. 3, 2016, entitled MULTI-CHANNEL LASER SYSTEM INCLUDING AN ACOUSTO-OPTIC MODULATOR (ACM) AND RELATED METHODS; and U.S. patent application Ser. No. 15/342,350 filed Nov. 3, 2016, entitled MULTI-CHANNEL ACOUSTO-OPTIC MODULATOR (AOM) AND RELATED METHODS. Both of these applications are assigned to the present Applicant Harris Corporation and are hereby incorporated herein in their entireties by reference.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

The invention claimed is:

1. A laser system comprising:
a laser source configured to generate a laser light beam;
an acousto-optic modulator (ACM) comprising
an acousto-optic medium configured to receive the laser light beam, and
a phased array transducer comprising a plurality of electrodes coupled to the acousto-optic medium and configured to cause the acousto-optic medium to output a zero order laser light beam and a first order diffracted laser light beam;
a beamsplitter downstream from the AOM and configured to split a sampled laser light beam from the zero order laser light beam;
a photodetector configured to receive the sampled laser light beam and generate a feedback signal associated therewith; and
a radio frequency (RF) driver configured to generate an RF drive signal to the phased array transducer electrodes so that noise is diverted to the first order diffracted laser light beam based upon the feedback signal.

2. The laser system of claim 1 wherein the RF driver is configured to drive alternating electrodes of the phased array transducer electrodes with different phases.

3. The laser system of claim 2 wherein
the RF driver is configured to drive the alternating electrodes with different phases within a range of 0° to 180°.

4. The laser system of claim 1 wherein an RF power level associated with the RF drive signal has a constant power.

5. The laser system of claim 1 wherein the sampled laser light beam utilizes ≤3% of the light of the zero order laser light beam.

6. The laser system of claim 1 wherein the first order diffracted laser light beam has ≤3% of the light from the laser source.

7. The laser system of claim 1 further comprising an ion trap, and wherein the beamsplitter is configured to direct the zero order laser light beam from the AOM to the ion trap.

8. The laser system of claim 1 further comprising a semiconductor workpiece having a photoresist layer, and wherein the beamsplitter is configured to direct the zero order laser light beam from the AOM to the photoresist layer.

9. The laser system of claim 1 further comprising a micromachining workpiece, and wherein the beamsplitter is configured to direct the zero order laser light beam from the AOM to the micromachining workpiece.

10. A laser system comprising:
a laser source configured to generate a laser light beam;
an acousto-optic modulator (AOM) comprising
an acousto-optic medium configured to receive the laser light beam, and
a phased array transducer comprising a plurality of electrodes coupled to the acousto-optic medium and configured to cause the acousto-optic medium to output a zero order laser light beam and a first order diffracted laser light beam;
a beamsplitter downstream from the AOM and configured to split a sampled laser light beam from the zero order laser light beam;
a photodetector configured to receive the sampled laser light beam and generate a feedback signal associated therewith; and
a radio frequency (RF) driver configured to generate an RF drive signal to the phased array transducer electrodes so that noise is diverted to the first order diffracted laser light beam based upon the feedback signal, the RF driver driving alternating electrodes of the phased array transducer electrodes with different phases, and an RF power level associated with the RF drive signal having a constant power.

11. The laser system of claim 10 wherein the RF driver is configured to drive the alternating electrodes with different phases within a range of 0° to 180°.

12. The laser system of claim 10 wherein the sampled laser light beam utilizes ≤3% of the light of the zero order laser light beam.

13. The laser system of claim 10 wherein the first order diffracted laser light beam has ≤3% of the light from the laser source.

14. The laser system of claim 10 further comprising an ion trap, and wherein the beamsplitter is configured to direct the zero order laser light beam from the AOM to the ion trap.

15. The laser system of claim 10 further comprising a semiconductor workpiece having a photoresist layer, and wherein the beamsplitter is configured to direct the zero order laser light beam from the AOM to the photoresist layer.

16. The laser system of claim 10 further comprising a micromachining workpiece, and wherein the beamsplitter is configured to direct the zero order laser light beam from the AOM to the micromachining workpiece.

17. A method comprising:
generating a laser light beam using a laser source directed at an acousto-optic medium;
causing the acousto-optic medium to output a zero order laser light beam and a first order diffracted laser light beam using a phased array transducer comprising a plurality of electrodes coupled to the acousto-optic medium;

splitting a sampled laser light beam from the zero order laser light beam using a beamsplitter downstream from the acousto-optic medium;

generating a feedback signal associated with the sampled laser light beam; and generating a radio frequency (RF) drive signal to the phased array transducer electrodes with an RF driver so that noise is diverted to the first order diffracted laser light beam based upon the feedback signal.

18. The method of claim 17 wherein generating the RF drive signal comprises generating the RF drive signal to drive alternating electrodes of the phased array transducer electrodes with different phases.

19. The method of claim 17 wherein an RF power level associated with the RF drive signal has a constant power.

20. The method of claim 17 wherein the sampled laser light beam utilizes ≤3% of the light of the zero order laser light beam.

21. The method of claim 17 wherein the first order diffracted laser light beam has ≤3% of the light from the laser source.

22. The method of claim 17 wherein splitting the beam further comprises directing the zero order laser light beam to an ion trap.

23. The method of claim 17 wherein splitting the beam further comprises directing the zero order laser light beam to a photoresist layer on a semiconductor workpiece.

24. The method of claim 17 wherein splitting the beam further comprises directing the zero order laser light beam to a micromachining workpiece.

\* \* \* \* \*